United States Patent [19]
Taylor et al.

[11] Patent Number: 5,851,920
[45] Date of Patent: *Dec. 22, 1998

[54] METHOD OF FABRICATION OF METALLIZATION SYSTEM

[75] Inventors: Donald S. Taylor; Gordon M. Grivna, both of Mesa; Wayne A. Cronin, Tempe; Kirby F. Koetz, Chandler, all of Ariz.

[73] Assignee: Motorola, Inc., Schaumburg, Ill.

[*] Notice: This patent issued on a continued prosecution application filed under 37 CFR 1.53(d), and is subject to the twenty year patent term provisions of 35 U.S.C. 154(a)(2).

[21] Appl. No.: 589,693

[22] Filed: Jan. 22, 1996

[51] Int. Cl.$^6$ .................................................. H01L 21/28
[52] U.S. Cl. ........................ 438/648; 438/656; 438/688
[58] Field of Search .................................. 437/192, 194, 437/197, 198; 204/192.17, 192.25; 257/763, 765; 438/648, 656, 688

[56] References Cited

U.S. PATENT DOCUMENTS

| | | | |
|---|---|---|---|
| 4,060,411 | 11/1977 | Goto et al. | 75/138 |
| 4,970,176 | 11/1990 | Tracy et al. | 437/187 |
| 5,016,081 | 5/1991 | Brown et al. | 437/197 |
| 5,270,255 | 12/1993 | Wong | 437/194 |
| 5,358,616 | 10/1994 | Ward | 204/192.15 |
| 5,360,524 | 11/1994 | Hendel et al. | 204/192.25 |
| 5,374,592 | 12/1994 | MacNaughton et al. | 437/194 |
| 5,407,863 | 4/1995 | Katsura et al. | 437/197 |
| 5,443,995 | 8/1995 | Nulman | 437/197 |
| 5,500,301 | 3/1996 | Onishi et al. | 204/192.17 |
| 5,554,889 | 9/1996 | Shin et al. | 257/765 |

FOREIGN PATENT DOCUMENTS

| | | |
|---|---|---|
| 3026026 | 1/1981 | Germany . |
| 58-124235 | 7/1983 | Japan . |
| 61-219156 | 9/1986 | Japan . |
| 240736 | 10/1987 | Japan . |

OTHER PUBLICATIONS

Taguchi et al., "Quarter Micron Hole Filling with SiN Sidewalls by Aluminum High Temperature Sputtering", Jun. 9–10, 1992, VMIC Conference 1992 ISMIC–101/92/0219, pp. 219–225.

Gardner et al., IEEE Transactions on ElectronDevices, "Layered and Homogeneous Films of Aluminum and Aluminum/Silicon with Titanium and Tungsten for Multilevel Interconnects", Feb. 1985, vol. ED–32, No. 2, pp. 174–183.

Shterenfeld–Lavie et al., "A 3–Level, 0.35$\mu$m interconnection process using an innovative, high pressure aluminum plug technology", Jun. 27–29, 1995, VMIC Conference 1995 ISMIC–104/95/0031, pp. 31–37.

*Primary Examiner*—John Niebling
*Assistant Examiner*—Thomas G. Bilodeau
*Attorney, Agent, or Firm*—George C. Chen

[57] ABSTRACT

A metallization system (19) for a semiconductor component (20) includes depositing a dielectric layer (12) over a substrate (10), etching a via (14) in the dielectric layer (12), sputtering a metal layer (17) of aluminum, copper, and tungsten over the dielectric layer (12) and in the via (14), and sputtering a different metal layer (18) of aluminum and copper over the first metal layer (17) and in the via (14). The metallization system (19) reduces the reliability issues associated with electromigration and stress migration while enhancing the ability to fill vias with large aspect ratios.

20 Claims, 1 Drawing Sheet

METHOD OF FABRICATION OF METALLIZATION SYSTEM

BACKGROUND OF THE INVENTION

This invention relates, in general, to semiconductor components, and more particularly, to metallizations systems for semiconductor components.

Metallization systems, which use metal reflow to fill via or contact structures, typically use a plurality of metal layers to form a single metal line. Generally, each of the plurality of metal layers are sequentially sputtered at a different temperature over the same semiconductor substrate to improve the via filling and other step coverage characteristics of the metallization system. However, the changes in temperature during the sputtering process lengthen the cycle time and increase the cost required to fabricate the metal line and the metallization system. Furthermore, while the temperature changes may alleviate problems related to step coverage, the metallization systems of the prior art still suffer from reliability problems due to electromigration and stress migration of the metal lines.

Accordingly, a need exists for a metallization system that is cost-effective and that reduces the reliability issues resulting from electromigration and stress migration. The method of fabricating the metallization system should not significantly increase the cycle time of manufacturing a semiconductor component and should be compatible with existing semiconductor manufacturing processes.

DETAILED DESCRIPTION OF THE DRAWINGS

Figure 1:
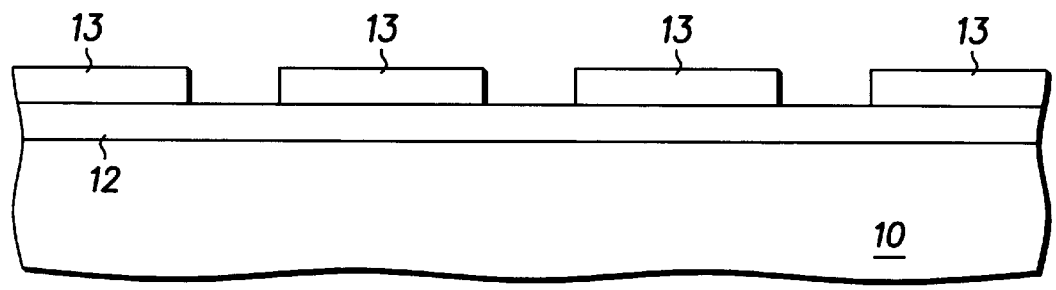
FIG. 1 illustrates a partial cross-sectional view of an embodiment of a semiconductor component in accordance with the present invention.

Turning to the figures for a more detailed description, FIG. 1 illustrates a partial cross-sectional view of an embodiment of a semiconductor component 20. Semiconductor component 20 includes a substrate 10 that is comprised of a semiconductor material including, but not limited to, silicon or gallium arsenide. At least one semiconductor device such as, for example, a field effect transistor (FET) is fabricated in substrate 10 using techniques known to those skilled in the art. Preferably, a plurality of FETs are fabricated in substrate 10 so that semiconductor component 20 forms an integrated circuit.

Semiconductor component 20 also includes a dielectric layer 12, which is preferably provided over substrate 10 by using a chemical vapor deposition technique. Dielectric layer 12 is comprised of an electrically insulating material such as, for example, silicon oxide, silicon nitride, or silicon oxynitride.

A patterned photoresist layer 13 is formed overlying dielectric layer 12 using lithographic techniques known in the art. Patterned photoresist layer 13 exposes portions of underlying dielectric layer 12 and is used as an etch mask to pattern dielectric layer 12. In an alternative embodiment, it is understood that etch masks of different compositions can be substituted for patterned photoresist layer 13. For example, when dielectric layer is comprised of silicon oxide, an etch mask of silicon nitride can be used in place of patterned photoresist layer 13.

Figure 2:
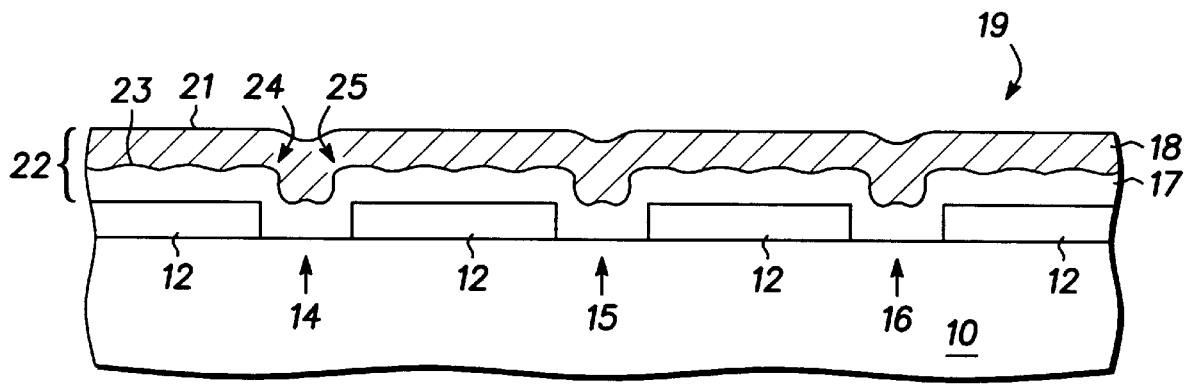
FIG. 2 portrays a partial cross-sectional view of the semiconductor component of FIG. 1 during fabrication of a metallization system in accordance with the present invention.

Continuing with the next figure, FIG. 2 portrays a partial cross-sectional view of the semiconductor component of FIG. 1 during fabrication of a metallization scheme or system 19. Elements of FIG. 2 that have the same reference numerals as FIG. 1 are the same as the corresponding FIG. 1 elements.

As a result of using techniques commonly known in the art to etch dielectric layer 12, openings or vias 14, 15, and 16 are formed in dielectric layer 12. After the etching process, patterned photoresist layer 13 of FIG. 1 is removed from dielectric layer 12, and metals layers 17 and 18 are provided over or overlying dielectric layer 12 and in vias 14, 15, and 16. Metal layers 17 and 18 form composite metal layer 22, which is part of metallization system 19 that is electrically coupled through vias 14, 15, or 16 to a plurality of FETs in substrate 10.

Metal layer 17 is comprised of a homogenous alloy of aluminum (Al), copper (Cu), and tungsten (W). The concentration by atomic weight of Al in metal layer 17 is greater than the concentration by atomic weight of Cu in metal layer 17 and is also greater than the concentration by atomic weight of W in metal layer 17. Additionally, the concentration by atomic weight of Cu in metal layer 17 is preferably greater than the concentration by atomic weight of W in metal layer 17. In the preferred embodiment, the atomic weight concentration of Cu in metal layer 17 is approximately 0.25–5 percent, and the atomic weight concentration of W in metal layer 17 is approximately 0.1–1 percent. The advantages of metal layer 17 are explained hereinafter.

Metal layer 17 is preferably disposed over dielectric layer 12 using an Eclipse sputtering tool, model MR2, manufactured by the Materials Research Corporation (MRC) in Orangeburg, N.Y. Using the Eclipse sputtering tool, metal layer 17 is preferably deposited at a rate of approximately 30–300 angstroms per second (Å/sec), at a temperature of approximately 400–600 degrees Celsius (°C.), and at a pressure of approximately 1–20 milliTorr (mT). Metal layer 17 is deposited over dielectric layer 12 by sputtering a sputtering target (not shown) with argon ions (not shown) at a flow rate of approximately 10–150 standard cubic centimeters per minute (sccm). In the preferred embodiment, the sputtering target consists essentially of a homogenous alloy of Al, Cu, and W, which have similar concentrations as described previously for metal layer 17. If a different sputtering tool is used, the temperatures, pressures, and deposition rates may vary from those previously identified specifically for the aforementioned Eclipse sputtering tool.

Afterwards, metal layer 18 is disposed over or overlying a surface 23 of metal layer 17 preferably using a similar temperature, pressure, deposition rate, sputtering technique, and sputtering tool as used for disposing metal layer 17 over dielectric layer 12. Metal layer 18 and the sputtering target (not shown) used to deposit metal layer 18 are both comprised of a homogenous alloy of Al and Cu, wherein the concentration by atomic weight of Al is higher than the concentration by atomic weight of Cu. In the preferred embodiment, both metal layer 18 and the sputtering target for metal layer 18 have a Cu concentration of approximately 0.25–5 percent by atomic weight and preferably do not include significant amounts of W. The advantages of metal layer 18 are discussed hereinafter.

The thicknesses of metal layers 17 and 18 is dependent upon the aspect ratio of vias 14, 15, and 16. As an example where vias 14, 15, and 16 have diameters of approximately 1 micron and where dielectric layer has a thickness of approximately 1 micron, metal layers 17 and 18 preferably have thicknesses of approximately 4,000 angstroms (Å) and 6,000 Å, respectively.

Figure 3:
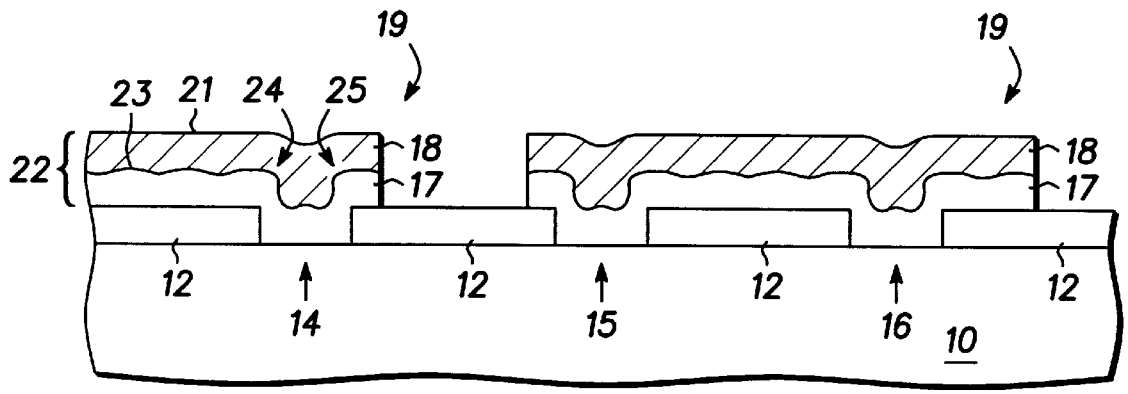
FIG. 3 depicts the semiconductor component of FIG. 2 after subsequent processing operations for the metallization system in accordance with the present invention.

Referring to the next figure, FIG. 3 depicts the semiconductor component of FIG. 2 after subsequent processing operations for metallization system 19. Elements of FIG. 3 that have the same reference numerals as FIG. 2 are the same as the corresponding FIG. 2 elements.

As depicted in FIG. 3 composite metal layer 22 is patterned. Preferably, composite metal layer 22 is dry etched with a chlorine-based or bromine-based reactive plasma. However, other dry or wet etchants can also be used to pattern composite metal layer 22. The desired pattern of composite metal layer 22 or metal layers 17 and 18 is defined by a photoresist layer or other etch mask (not shown). As portrayed in FIG. 3, at least a portion of metal layers 17 and 18 remains in vias 14, 15, and 16 after the patterning process.

Prior art metallization systems suffer from electromigration and stress migration of aluminum. However, metallization system 19 is more resistant to stress migration problems compared to the prior art because metal layer 17 is comprised of W, which restricts the migration of Al due to stress. The concentration of W in metal layer 17 is preferably kept at a minimum because of its higher resistivity compared to aluminum.

Although the W in metal layer 17 reduces or alleviates stress migration issues, the W also restricts the mobility of Al during deposition of metal layer 17. Consequently, it is more difficult for metal layer 17 to form a planar layer or to fill in vias 14, 15, and 16 as compared to metal layer 18, which is not comprised of W. Therefore, metal layer 18 is deposited over metal layer 17 to provide a more planar surface 21 on which further interconnect layers (not shown) can more easily be formed.

The Cu in metal layers 17 and 18 reduces the prior art problems associated with electromigration in metal lines comprised of Al, but the Cu also increases the difficulty in etching metal layers 17 and 18. Therefore, similar to the W in metal layer 17, the Cu in metal layers 17 and 18 is also kept to a minimum.

It is desirable to eliminate titanium (Ti) from metal layers 17 and 18 to eliminate problems of increased resistivity and particulate induced defectivity that are associated with Ti and other refractory metals.

Some prior art metallization systems use W plugs to fill vias that couple AlCu metal lines. However, W plug metallization systems suffer from electromigration. First, the Cu from the AlCu metal lines diffuses away from the W plugs along the direction of current flow, and then, the Al (now without Cu) near the W plug migrates along the same electrical current path. As a result of the diffusion of Cu and the subsequent electromigration of Al, voids are formed in the prior art metallization system, and the electrical current path is broken. The present invention reduces the problems associated with using W plugs because metal layers 17 and 18 are deposited into vias 14, 15, and 16. Vias 14, 15, and 16 are not filled with a different material compared to the material used for the metal lines in metallization system 19. Because metal layers 17 and 18 contain a source of Cu, the prior art problem of Cu depletion does not occur in metallization system 19 as the Cu migrates, and consequently, a discontinuous electrical path is not created at vias 14, 15, and 16.

Consequently, Cu depletion and void formation does not occur around vias 14, 15, and 16 during the use of metallization system 19.

Returning back to the discussion of FIG. 2, metal layers 17 and 18 are preferably deposited at a similar and substantially constant temperature in the preferred embodiment to reduce the cycle time for fabricating metallization system 19. Preferably, the deposition temperature for metal layers 17 and 18 is at least half of the plastic deformation temperature of metal layers 17 and 18. The plastic deformation temperature is the temperature at which a material begins to change shape. Typically, the plastic deformation temperature is approximately half of the melting temperature for a specific material.

In prior art processes where different metal layers are deposited at different temperatures, time is wasted while waiting for the substrates to cool down after a sputter etch surface clean prior to a cold metal deposition. A considerable amount of time is wasted in the prior art processes while waiting for the new temperature to stabilize because the deposition chamber is kept under vacuum, which has poor thermal conductivity. Therefore, by depositing metal layers 17 and 18 at similar temperatures, the cycle time for fabricating metallization system 19 is reduced compared to the prior art processes.

Because of the elevated temperature at which metal layers 17 and 18 are deposited, metal layers 17 and 18 have good step coverage over the topography of dielectric layer 12. Preferably, metal layers 17 and 18 completely fill vias 14, 15, and 16 and do not form voids or air gaps in or over the vias. However, to achieve adequate step coverage, metal layers 17 and 18 should be deposited at a temperature equal to or greater than their respective plastic deformation temperatures as described previously.

If metal layer 17 is deposited at room temperature or approximately 25° C., which is below its plastic deformation temperature, corners 24 and 25 of metal layer 17 will be larger and closer together than depicted in FIGS. 2 and 3. However, when deposited at room temperature, metal layer 17 will still not completely fill via 14 because of the reduced mobility of Al resulting from the W in metal layer 17 as discussed previously. However, when metal layer 18 is subsequently deposited, metal layer 18 also cannot fill via 14 because via 14 is now blocked or obstructed by the enlarged corners 24 and 25 of metal layer 17. Consequently, if metal layer 17 is deposited at room temperature, a void or air gap may be formed in via 14, which causes reliability problems. Therefore, metal layer 17 is deposited at an elevated temperature to eliminate void formation and to provide the ability to fill vias with higher aspect ratios compared to the prior art.

While the invention has been particularly shown and described with reference to preferred embodiments, it will be understood by those skilled in the art that changes in form and detail may be made without departing from the spirit and scope of the invention. For instance, instead of being a semiconductor substrate, substrate 10 can be a circuit or assembly board over which metallization system 19 is fabricated. As an additional example, instead of being comprised of aluminum and tungsten, metal layer 17 can be comprised of aluminum and a different material that reduces the aluminum mobility including, but not limited to, chromium, scandium, or molybdenum.

Therefore, in accordance with the present invention, it is apparent there has been provided an improved metallization system that overcomes the disadvantages of the prior art.

The present invention eliminates reliability problems associated with electromigration and stress migration in the prior art by using a composite metal layer comprised of aluminum, copper, and tungsten. Additionally, the present invention reduces the cycle time for fabricating a metallization system by using a similar temperature to deposit the composite metal layer. The present invention expands the processing window of hot metal via filling techniques and allows for the filling of higher aspect ratio vias. The present invention is also cost effective and is compatible with existing semiconductor processing techniques.

We claim:

1. A method of making a semiconductor component comprising:

providing a substrate;

providing a first metal layer comprised of aluminum and a material that reduces aluminum mobility, the first metal layer overlying the substrate; and providing a second metal layer consisting essentially of aluminum and copper, the second metal layer overlying the first metal layer, wherein the step of providing the first metal layer includes providing the first metal layer includes providing a homogeneous layer of aluminum and the material at a first temperature greater than approximately half of a plastic deformation temperature of the first metal layer and wherein the step of providing the second metal layer includes providing a homogeneous layer of aluminum and copper at a second temperature greater than approximately half of a plastic deformation temperature of the second metal layer.

2. The method according to claim 1, wherein the step of providing the first metal layer includes providing tungsten for the material and providing a concentration of aluminum, a concentration of copper, and a concentration of tungsten for the first metal layer, wherein the concentration of aluminum is higher than the concentration of copper and the concentration of tungsten.

3. A method of making a semiconductor component comprising:

providing a substrate;

providing a first metal layer comprised of aluminum and a material that reduces aluminum mobility, the first metal layer overlying the substrate; and providing a second metal layer consisting essentially of aluminum and copper, the second metal layer overlying the first metal layer, wherein the step of providing the first metal layer includes providing a homogeneous layer of aluminum and the material and wherein the step of providing the second metal layer includes providing a homogeneous layer of aluminum and copper, wherein the step of providing the first metal layer includes providing tungsten for the material and providing a concentration of aluminum, a concentration of copper, and a concentration of tungsten for the first metal layer, wherein the concentration of aluminum is higher than the concentration of copper and the concentration of tungsten, and wherein the step of providing the first metal layer includes providing the concentration of copper higher than the concentration of tungsten.

4. A method of making a semiconductor component comprising:

providing a substrate;

providing a first metal layer comprised of aluminum and a material thay reduces aluminum mobility, the first metal layer overlying the substrate; and providing a second metal layer consisting essentially of aluminum and copper, the second metal layer overlying the first metal layer, wherein the step of providing the first metal layer includes providing a homogeneous layer of aluminum and copper, and wherein the step of providing the first metal layer includes providing the first metal layer at a temperature and sputtering a first sputtering target consisting of aluminum, copper, and tungsten wherein thr first sputtering target has a first atomic, weight concentration of copper of approximately 0.25–5 percent and an atomic weight concentration of tungsten of approximately 0.1–1 percent.

5. The method according to claim 4, wherein the step of providing the second metal layer includes providing the second metal layer at the temperature and sputtering a second sputtering target consisting essentially of aluminum and copper wherein the second sputtering target has a second atomic weight concentration of copper of approximately 0.25–5 percent.

6. A method of making a semiconductor component comprising:

providing a substrate;

providing a first metal layer comprised of aluminum and a material that reduces aluminum mobility, the first metal layer overlying the substrate; and providing a second metal layer consisting essentially of aluminum and copper, the second metal layer overlying the first metal layer, wherein the step of providing the first metal layer includes providing the first metal layer at a first temperature greater than approximately half of a plastic deformation temperature of the first metal layer, and wherein the step of providing the second metal layer includes providing the second metal layer at a second temperature greater than approximately half of a plastic deformation temperature of the second metal layer.

7. A method of making a semiconductor component comprising:

providing a substrate;

providing a first metal layer comprised of aluminum and a material that reduces aluminum mobility, the first metal overlying the substrate; and providing a second metal layer consisting essentially of aluminum and copper, the second metal layer overlying the first metal layer, wherein the steps of providing the first and second metal layers include providing the first and second metal layers at a temperature of approximately 400–600 degrees Celsius.

8. The method according to claim 1, further comprising the step of providing a dielectric layer between the substrate and the first metal layer, the dielectric layer having an opening, a portion of the first metal layer and a portion of the second metal layer located in the opening.

9. The method according to claim 1, wherein the step of providing the first metal layer includes selecting the material from the group consisting of tungsten, molybdenum, scandium, and chromium.

10. A method of making a semiconductor component comprising:

providing a substrate;

depositing a dielectric layer over the substrate;

etching a via in the dielectric layer;

sputtering a first metal layer consisting essentially of aluminum, copper, and tungsten overlying the dielectric layer and in the via wherein the step of sputtering the first metal layer includes using a first sputtering target having a first concentration by weight of copper of approximately 0.25–5 percent and having a concentration by weight of tungsten of approximately 0.1–1 percent; and sputtering a second metal layer consisting essentially of aluminum and copper overlying the first metal layer and in the via and wherein the second metal layer is substantially devoid of tungsten.

11. The method according to claim 10, wherein the step of sputtering the first metal layer includes using a first sputtering target having a first concentration by weight of copper of approximately 0.25–5 percent and having a concentration by weight of tungsten of approximately 0.1–1 percent.

12. The method according to claim 11, wherein the step of sputtering the second metal layer includes using a second sputtering target having a second concentration by weight of copper of approximately 0.25–5 percent.

13. A method of fabricating a semiconductor component comprising:

providing a substrate;

depositing a dielectric layer over the substrate;

etching a via in the dielectric layer;

sputtering a first metal layer consisting essentially of aluminum, copper, and tungsten overlying the dielectric layer and in the via; and sputtering a second metal layer consisting essentially of aluminum and copper overlying the first metal layer and in the via wherein the steps of sputtering the first and second metal layers include sputtering the first and second metal layers at a substantially constant temperature of approximately 400–600 degrees Celsius.

14. The method of claim 1 wherein the step of providing the first metal layer includes providing the first metal layer consisting of aluminum, copper, and the material that reduces aluminum mobility.

15. The method of claim 1 wherein the step of providing the second metal layer includes depositing the second metal layer layer in contact with the first metal layer.

16. The method of claim 1 wherein the the step of providing the second metal layer includes providing the second metal layer at a thickness of approximately 6,000 angstroms and wherein the step of providing the first metal layer includes providing the first metal layer at a thickness of approximately 4,000 angstroms.

17. The method of claim 1 wherein the step of providing the first metal layer includes providing tungsten for the material and providing a concentration of aluminum, a concentration of copper, and a concentration of tungsten for the first metal layer, wherein the concentration of aluminum is higher than the concentration of copper higher than the concentration of tungsten, and wherein the step of providing the first metal layer includes providing the concentration of copper higher than the concentration of tungsten.

18. The method of claim 17 wherein the steps of providing the first and second metal layers include providing the first and second metal layers at a temperature of approximately 400–600 degrees Celsius.

19. The method of claim 1 wherein the step of providing the first metal layer includes providing the first metal layer at a temperature and sputtering a first sputtering target consisting of aluminum, copper, and tungsten wherein the first sputtering target has a first atomic weight concentration of copper of approximately 0.25–5 percent and an atomic weight concentration of tungsten of approximately 0.1–1 percent.

20. The method of claim 19 wherein the step of providing the second metal layer at the temperature and sputtering a second sputtering target consisting essentially of aluminum and copper wherein the second sputtering target has a second atomic weight concentration of copper of approximately 0.25–1 percent.

* * * * *

UNITED STATES PATENT AND TRADEMARK OFFICE
CERTIFICATE OF CORRECTION

PATENT NO.    : 5,851,920
DATED         : December 22, 1998
INVENTOR(S)   : Donald S. Taylor et al.

Page 1 of 1

It is certified that error appears in the above-identified patent and that said Letters Patent is hereby corrected as shown below:

Column 5,
Line 23, delete "providing the first metal layer includes providing".

Column 6,
Line 2, delete "thay" and add -- that --.
Line 9, before "copper" add -- the material and wherein the step of providing the second metal layer includes providing a homogeneous layer of aluminum --.
Line 14, delete "thr" and add -- the --.

Column 7,
Lines 17-21, delete entire claim and add -- The method according to claim 10, wherein the step of sputtering the second metal layer includes using a second sputtering target having a second concentration by weight of copper of approximately 0.25-5 percent --.
Lines 22-25, delete entire claim and add -- The method according to claim 11, wherein the steps of sputtering the first and second metal layers includes sputtering the first and second sputtering targets with argon ions --.

Column 8,
Line 18, delete the second "higher than" and add -- and --.
Line 36, after "layer" add -- includes providing the second metal layer --.
Line 40, delete "1" and add -- 5 --.

Signed and Sealed this

Nineteenth Day of August, 2003

JAMES E. ROGAN
*Director of the United States Patent and Trademark Office*